United States Patent
Truyens

(10) Patent No.: US 8,286,785 B2
(45) Date of Patent: Oct. 16, 2012

(54) SOLAR CELL TRANSPORT

(75) Inventor: Carolus Truyens, Rotselaar (BE)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/119,517

(22) PCT Filed: May 4, 2010

(86) PCT No.: PCT/US2010/033484
§ 371 (c)(1), (2), (4) Date: Mar. 17, 2011

(87) PCT Pub. No.: WO2010/135077
PCT Pub. Date: Nov. 25, 2010

(65) Prior Publication Data
US 2012/0055761 A1    Mar. 8, 2012

Related U.S. Application Data

(60) Provisional application No. 61/180,060, filed on May 20, 2009.

(51) Int. Cl.
*B65G 23/00* (2006.01)
*B65G 25/00* (2006.01)

(52) U.S. Cl. .......... 198/832.1; 198/409; 198/699.1; 198/395

(58) Field of Classification Search .......... 198/846, 198/832.1, 699, 699.1, 690.2, 577, 383, 397.06, 198/409, 395, 867.11, 867.15; 414/782, 414/784, 936
See application file for complete search history.

(56) References Cited

U.S. PATENT DOCUMENTS

| | | | | |
|---|---|---|---|---|
| 3,690,437 A | * | 9/1972 | Kammann | 198/397.01 |
| 3,894,625 A | * | 7/1975 | Boyle et al. | 198/357 |
| 4,618,054 A | * | 10/1986 | Muller | 198/409 |
| 6,095,316 A | * | 8/2000 | Redden | 198/415 |
| 6,769,529 B2 | * | 8/2004 | Fournier et al. | 198/403 |
| 6,868,653 B2 | * | 3/2005 | Ballestrazzi et al. | 53/447 |
| 2005/0258019 A1 | * | 11/2005 | Tiberi | 198/867.11 |
| 2008/0092680 A1 | | 4/2008 | Kim et al. | |

FOREIGN PATENT DOCUMENTS

| | | |
|---|---|---|
| JP | 6-239440 | 8/1994 |
| JP | 11-345858 | 12/1999 |
| JP | 2004-323146 | 11/2004 |
| JP | 2008-085254 | 4/2008 |
| KR | 10-2009-0045691 | 5/2009 |

* cited by examiner

*Primary Examiner* — Gene Crawford
*Assistant Examiner* — Keith R Campbell
(74) *Attorney, Agent, or Firm* — Luedeka Neely Group, P.C.

(57) ABSTRACT

A transport system for substrates, the transport system having at least one belt for receiving the substrates thereon, retainers disposed at spaced distances on the belt, the spaced distances being at least as wide as a width of the substrates, the retainers rising to an elevation above the belt that is sufficient to stop the substrates from sliding when the substrates bump against the retainers, a motor for moving the belt, and a motion controller for providing asymmetric acceleration and deceleration of the belt, such that the belt decelerates faster than the belt accelerates, thereby aligning the substrates against the retainers through successive acceleration and deceleration cycles.

20 Claims, 2 Drawing Sheets

SOLAR CELL TRANSPORT

FIELD

This application claims benefits and priority on prior U.S. provision application Ser. No. 61/180,060, filed May 5, 2009 and PCT patent application Ser. No. US2010/33484 filed May 4, 2010. This invention relates to the field of solar cell fabrication. More particularly, this invention relates to the transport of solar cells during fabrication.

INTRODUCTION

Solar cells are manufactured on production lines where the cells are transported in wafer form by conveyor belts from one production step to the next. The belt is not continuously moving, but stops at different processing and inspection steps along the path.

Unfortunately, the cell substrates tend to slide around on the belt during transport of the substrates from station to station. In extreme cases, substrates can even slip off of the belt and be contaminated, damaged, or destroyed. This tends to require a registration procedure of some sort at various ones of the production stations—be it either an automated registration or a manual registration—so that the substrate is replaced into a desired position prior to the processing or inspection.

To overcome this problem, vacuum clamping systems have been added to conveyor belts, which systems draw the substrates tightly against the belt and constrain the substrates from unwanted movement. Unfortunately, such systems make the transport system highly complex and expensive.

What is needed, therefore, is a system that overcomes problems such as those described above, at least in part.

SUMMARY OF THE CLAIMS

The above and other needs are met by a transport system for substrates, the transport system having at least one belt for receiving the substrates thereon, retainers disposed at spaced distances on the belt, the spaced distances being at least as wide as a width of the substrates, the retainers rising to an elevation above the belt that is sufficient to stop the substrates from sliding when the substrates bump against the retainers, a motor for moving the belt, and a motion controller for providing asymmetric acceleration and deceleration of the belt, such that the belt decelerates faster than the belt accelerates, thereby aligning the substrates against the retainers through successive acceleration and deceleration cycles.

In various embodiments according to this aspect of the invention, the at least one belt is a single belt that is wider than the substrates. Alternately, the at least one belt is a single belt is narrower than the substrates. In some embodiments the at least one belt is two belts, where each of the two belts is narrower than half a width of the substrates. In some embodiments the retainers are slanted toward the top such that the substrates can be easily removed from the belt without the substrates binding against the retainers. In some embodiments the retainers are configured to align the substrates in a single dimension, and in other embodiments the retainers are configured to align the substrates in two dimensions. In some embodiments the belt has a directionally frictional surface. In some embodiments the at least one belt occludes no more than about twenty percent of a backside surface area of each of the substrates.

According to another aspect of the invention there is described a method for aligning substrates on a transport belt, the method comprising the steps of accelerating the transport belt at a first rate that is insufficient to cause the substrates to slide backwards on the transport belt during acceleration, and decelerating the transport belt at a second rate that is faster than the first rate, where the second rate is sufficient to cause the substrates to slide forwards on the transport belt during deceleration, thereby aligning the substrates against retainers disposed at spaced intervals on the transport belt during successive acceleration and deceleration cycles.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The various embodiments of the present invention dispose the substrates on which the solar cells are fabricated to a known position on a transport belt, and retain the substrates in those positions. This is achieved by one or both of a specially-configured transport belt and a motion controller for the transport belt.

Figure 1:
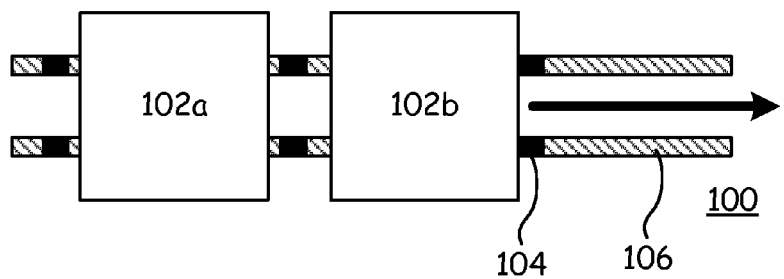
FIG. 1 is a top plan view of a transport system according to an embodiment of the present invention.

With reference now to FIG. 1, there is depicted a top plan view of a transport system 100 according to an embodiment of the present invention. The transport system 100 uses belts 106 to move the substrates 102 in the direction as indicated by the arrow. In the embodiment of FIG. 1, two belts 106 are depicted. However, it is appreciated that any number of belts 106 could be used, from one belt 106 up to many belts 106.

Figure 2:
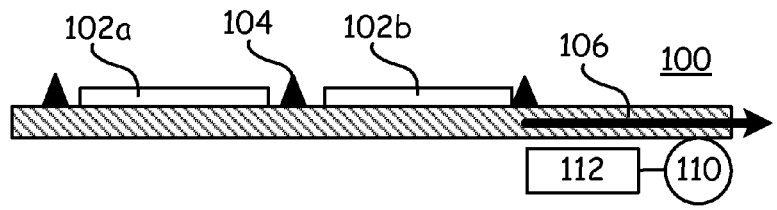
FIG. 2 is a side view of a transport system according to an embodiment of the present invention.

With reference now to FIG. 2, the belts 106 are equipped with retainers 104 against which the substrates 102 can be aligned, such that the substrates 102 are in a known position. A motion controller 112 implements an asymmetrical acceleration and deceleration of the belt 106. This is accomplished by controlling the speed of the motor 110 that moves the belt 106. In other words, the acceleration of the belt 106 is slower than the deceleration of the belt 106.

In this manner, the substrates 102 might tend to slide back away from the retainers 104 during acceleration of the belt 106, such as depicted in regard to substrate 102a, but have a greater tendency to slide up against the retainers 104 during deceleration of the belt 106, such as depicted in regard to substrate 102b, when the movement of the belt 106 is in the direction as indicated. If the acceleration is sufficiently slow, then the substrates 102 will not slide away from the retainers 104 at all. Similarly, if the deceleration is sufficiently fast, the substrates 102 will always slide up to be adjacent the retainers 104 when the substrate 102 is stopped at a station for processing or inspection.

Figure 3:
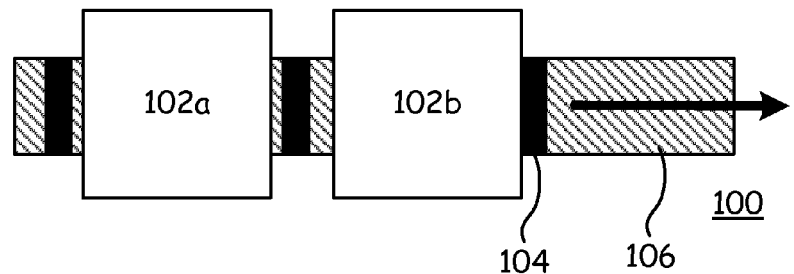
FIG. 3 is a top plan view of a transport system according to an embodiment of the present invention.

In one embodiment the retainers 104 are slanted so that the substrates 102 do not get stuck when they are picked up from the belt 106. FIG. 3 depicts an embodiment where only one belt 106 is used. The retainers 104 depicted thus far tend to align the substrates 102 in only one direction (one dimension) according to the direction of travel of the belt 106.

Figure 4:
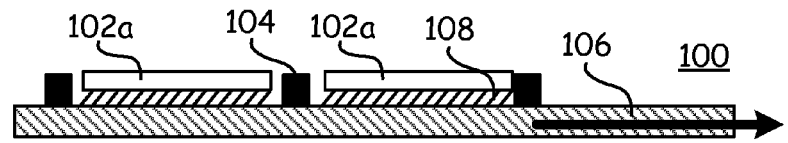
FIG. 4 is a side view of a transport system according to an embodiment of the present invention.

FIG. 4 depicts an embodiment where the belt 106 has a textured surface 108, such that there is a greater coefficient of friction between the belt 106 and the substrate 102 when the substrate 102 tries to slide forward, and a reduced coefficient of friction between the belt 106 and the substrate 102 when the substrate 102 tries to slide backward. Such a textured surface 108 is defined as a "directionally frictional surface" for the purpose of the claims. In the embodiment of FIG. 4, this textured surface is provided in the form of slanting ridges of material. However, other textured surfaces can also provide this same functionality.

Figure 5:
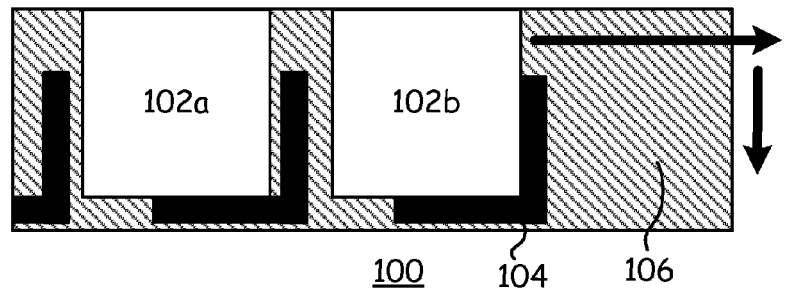
FIG. 5 is a top plan view of a transport system according to an embodiment of the present invention.
Figure 6:
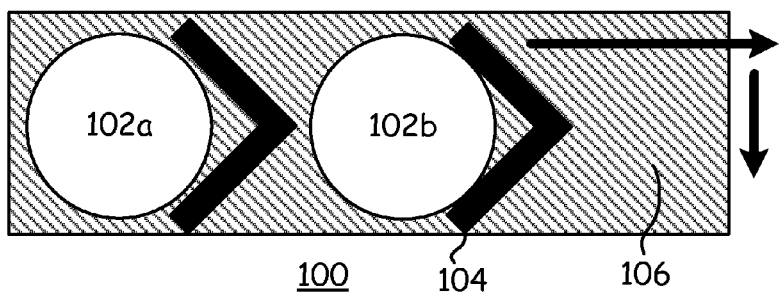
FIG. 6 is a top plan view of a transport system according to an embodiment of the present invention.

FIG. 5 depicts an embodiment where the belt 106 is wider than the substrate 102. In addition, the retainers 104 have components that serve to retain the substrates 102 in two orthogonal directions of motion (two dimensions), as depicted by the arrows in the figure. FIG. 6 depicts an embodiment where the substrates 102 are circular instead of square, and the retainers 104 serve to retain the substrates 102 in two orthogonal directions of motion, and also tend to center the substrates 102 on the belt 106. Thus, a wide variety of embodiments for the present invention are contemplated herein.

Figure 7:
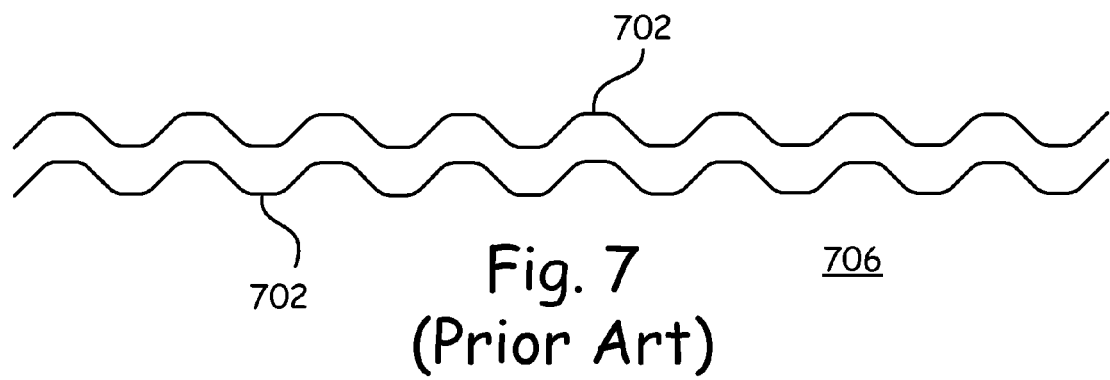
FIG. 7 is a side view of a prior art dual-toothed conveyor belt.
Figure 8:
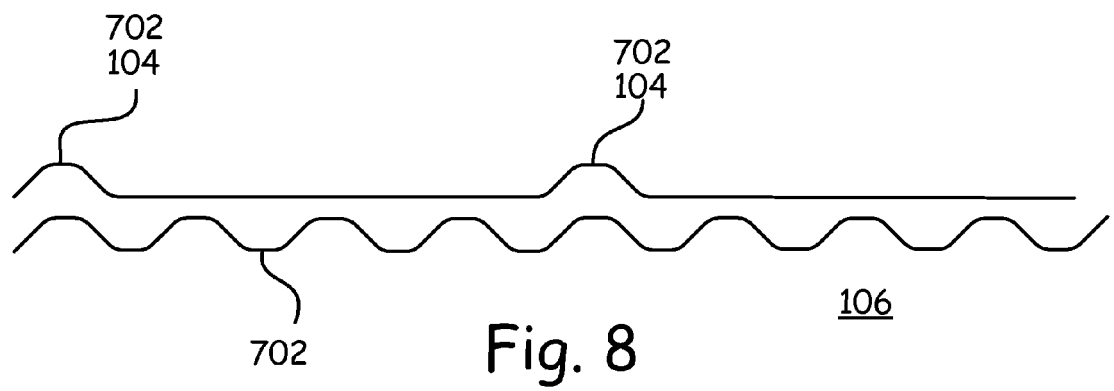
FIG. 8 is a side view of a belt that has been formed according to an embodiment of the present invention.

In one embodiment, the belt 106 is manufactured from a commercially-available dual-toothed belt 706, as depicted in FIG. 7. The belt 706 is fabricated with teeth 702 disposed on either side of the belt. As depicted in FIG. 7, the belt 706 is modified by machining away (or otherwise removing) most of the teeth 702 on the top side of the belt 106, and leaving one or more teeth 702, which act as the retainers 104. The benefits of this method of forming the belt 106 is that it is relatively inexpensive and easy to implement, with no additional steps required to determine the location of and connect the retainers 104 onto the belt 106 surface. Further, this method provides for very accurate retainer 104 positions, due to the controlled positioning of the teeth 702 during the initial fabrication of the belt 106. In addition, the surface properties of the teeth 702 fit the profile as desired for a retainer 104, as described above, and are fashioned in such a manner that they will be very durable.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A transport system for substrates, the transport system comprising:
    at least one belt for receiving the substrates thereon,
    retainers disposed at spaced distances on the belt, the spaced distances being at least as wide as a width of the substrates, the retainers rising to an elevation above the belt that is sufficient to stop the substrates from sliding when the substrates bump against the retainers,
    a motor for moving the belt, and
    a motion controller for providing asymmetric acceleration and deceleration of the belt, such that the belt decelerates faster than the belt accelerates, thereby aligning the substrates against the retainers through successive acceleration and deceleration cycles.

2. The transport system of claim 1, wherein the at least one belt comprises a single belt that is wider than the substrates.

3. The transport system of claim 1, wherein the at least one belt comprises a single belt is narrower than the substrates.

4. The transport system of claim 1, wherein the at least one belt comprises two belts, where each of the two belts is narrower than half a width of the substrates.

5. The transport system of claim 1, wherein the retainers are slanted toward the top such that the substrates can be easily removed from the belt without the substrates binding against the retainers.

6. The transport system of claim 1, wherein the retainers are configured to align the substrates in a single dimension.

7. The transport system of claim 1, wherein the retainers are configured to align the substrates in two dimensions.

8. The transport system of claim 1, wherein the belt has a directionally frictional surface.

9. The transport system of claim 1, wherein the at least one belt occludes no more than about twenty percent of a backside surface area of each of the substrates.

10. A transport system for substrates, the transport system comprising:
    two belts for receiving the substrates thereon, where each of the two belts are narrower than half a width of the substrates,
    retainers disposed at spaced distances on the belts, the spaced distances being at least as wide as a width of the substrates, the retainers rising to an elevation above the belts that is sufficient to stop the substrates from sliding when the substrates bump against the retainers, wherein the retainers are slanted toward the top such that the substrates can be easily removed from the belts without the substrates binding against the retainers,
    a motor for moving the belts, and
    a motion controller for providing asymmetric acceleration and deceleration of the belts, such that the belts decelerate faster than the belts accelerate, thereby aligning the substrates against the retainers through successive acceleration and deceleration cycles.

11. The transport system of claim 10, wherein the retainers are configured to align the substrates in a single dimension.

12. The transport system of claim 10, wherein the retainers are configured to align the substrates in two dimensions.

13. The transport system of claim 10, wherein the belts have directionally frictional surfaces.

14. The transport system of claim 10, wherein the at least one belt occludes no more than about twenty percent of a backside surface area of each of the substrates.

15. A method for aligning substrates on a transport belt, the method comprising the steps of:
    accelerating the transport belt at a first rate that is insufficient to cause the substrates to slide backwards on the transport belt during acceleration, and
    decelerating the transport belt at a second rate that is faster than the first rate, where the second rate is sufficient to cause the substrates to slide forwards on the transport belt during deceleration, thereby aligning the substrates against retainers disposed at spaced intervals on the transport belt during successive acceleration and deceleration cycles.

16. The method of claim 15, wherein the transport belt comprises two belts, where each of the two belts is narrower than half a width of the substrates.

17. The method of claim 15, wherein the retainers are slanted toward the top such that the substrates can be easily removed from the transport belt without the substrates binding against the retainers.

18. The method of claim 15, wherein the retainers are configured to align the substrates in a single dimension.

19. The method of claim 15, wherein the retainers are configured to align the substrates in two dimensions.

20. The method of claim 15, wherein the transport belt has a directionally frictional surface.

* * * * *